(12) United States Patent
Xie et al.

(10) Patent No.: US 10,559,665 B2
(45) Date of Patent: Feb. 11, 2020

(54) FIELD-EFFECT TRANSISTOR

(71) Applicant: Qorvo US, Inc., Greensboro, NC (US)

(72) Inventors: Jinqiao Xie, Allen, TX (US); Edward A. Beam, III, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/410,282

(22) Filed: May 13, 2019

(65) Prior Publication Data

US 2019/0267452 A1    Aug. 29, 2019

Related U.S. Application Data

(63) Continuation-in-part of application No. 15/980,785, filed on May 16, 2018, now Pat. No. 10,290,713.

(60) Provisional application No. 62/538,852, filed on Jul. 31, 2017.

(51) Int. Cl.
| | | |
|---|---|---|
| *H01L 29/778* | (2006.01) | |
| *H01L 29/20* | (2006.01) | |
| *H01L 29/66* | (2006.01) | |
| *H01L 29/78* | (2006.01) | |

(52) U.S. Cl.
CPC .... *H01L 29/2003* (2013.01); *H01L 29/66462* (2013.01); *H01L 29/7786* (2013.01); *H01L 29/78* (2013.01)

(58) Field of Classification Search
None
See application file for complete search history.

(56) References Cited

U.S. PATENT DOCUMENTS

| | | |
|---|---|---|
| 10,290,713 B2 | 5/2019 | Xie et al. |
| 2009/0045438 A1 | 2/2009 | Inoue et al. |

OTHER PUBLICATIONS

Lour, W. S. "Multiple Pulse-Doped Channel AlGaAs/InGaAs/GaAs HFET's" Electrochem. Soc. Proc. vol. 97-1 copyright 1997 pp. 197-201 (Year: 1997).*
Aparin, Vladimir, et al., "Modified Derivative Superposition Method for Linearizing FET Low Noise Amplifiers," IEEE Radio Frequency Integrated Circuits Symposium, 2004, pp. 105-108.
Huang, Jun-Chi, et al., "Characteristics of delta-doped InAlAs/InGaAs/InP high electron mobility transistors with a linearly graded InxGa1-xAs channel," Semiconductor Science and Technology, vol. 21, Mar. 21, 2006, IOP Publishing Ltd, pp. 619-625.

(Continued)

*Primary Examiner* — Grant S Withers
(74) *Attorney, Agent, or Firm* — Withrow & Terranova, P.L.L.C.

(57) ABSTRACT

A field-effect transistor having a transconductance (gm) that remains within 65% of a maximum gm value over at least 85% of a gate voltage range that transitions the field-effect transistor between an on-state that allows substantial current flow through the channel layer and an off-state that prevents substantial current flow through the channel layer is disclosed. The field-effect transistor includes a substrate and a channel layer having a proximal boundary relative to the substrate and a distal boundary relative to the substrate. The channel layer is disposed over the substrate and comprises a compound semiconductor material that includes at least one element having a concentration that is graded between the proximal boundary and the distal boundary.

20 Claims, 11 Drawing Sheets

(56) References Cited

OTHER PUBLICATIONS

Inoue, Kazutaka, et al., "Linearity Improvement of GaN HEMT for RF Power Amplifiers," Compound Semiconductor Integrated Circuit Symposium, Oct. 13-16, 2013, Monterey, California, IEEE, 4 pages.
Liu, Jie, et al., "Highly Linear Al0.3Ga0.7N-Al0.05Ga0.95N-GaN Composite-Channel HEMTs," IEEE Electron Device Letters, vol. 26, Issue 3, Mar. 2005, pp. 145-147.
Park, Pil Sung, et al., "Electron gas dimensionality engineering in AlGaN/GaN high electron mobility transistors using polarization," Applied Physics Letters, vol. 100, 2012, American Institute of Physics, 4 pages.
Qu, Shenqi, et al., "Analysis of transconductance characteristic of AlGaN/GaN HEMTs with graded AlGaN layer," European Physical Journal: Applied Physics, vol. 66, Issue 2, Jun. 5, 2014, EDP Sciences, 7 pages.
Notice of Allowance for U.S. Appl. No. 15/980,785, dated Jan. 8, 2019, 8 pages.
Non-Final Office Action for U.S. Appl. No. 15/980,785, dated Nov. 27, 2018, 12 pages.

\* cited by examiner

FIELD-EFFECT TRANSISTOR

RELATED APPLICATIONS

This application is a continuation-in-part of U.S. patent application Ser. No. 15/980,785, filed May 16, 2018, now U.S. Pat. No. 10,290,713, which claims the benefit of provisional patent application Ser. No. 62/538,852, filed Jul. 31, 2017, the disclosures of which are hereby incorporated herein by reference in their entireties.

FIELD OF THE DISCLOSURE

The present disclosure relates to field-effect transistors and methods of their manufacture.

BACKGROUND

At present, field-effect transistors based upon gallium nitride semiconductor technology are desired by both commercial and military communication markets. The commercial communication market has particularly crowded communication bands. As such, there is a demand for highly linear field-effect transistors, especially in the millimeter wave communication bands allocated for fifth-generation (5G) cellular communications. Therefore, an unsatisfied need continually remains for highly linear field-effect transistors, and this need is particular acute for field-effect transistors based upon gallium nitride semiconductor technology.

SUMMARY

A field-effect transistor having a transconductance (gm) that remains within 65% of a maximum gm value over at least 85% of a gate voltage range that transitions the field-effect transistor between an on-state that allows substantial current flow through the channel layer and an off-state that prevents substantial current flow through the channel layer is disclosed. The field-effect transistor includes a substrate and a channel layer having a proximal boundary relative to the substrate and a distal boundary relative to the substrate. The channel layer is disposed over the substrate and comprises a compound semiconductor material that includes at least one element having a concentration that is graded between the proximal boundary and the distal boundary. Further included are a gate, a source, and a drain disposed over the channel layer, wherein the gate is electrically isolated from the channel layer such that a gate voltage applied to the gate controls current flow between the source and the drain.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 1:
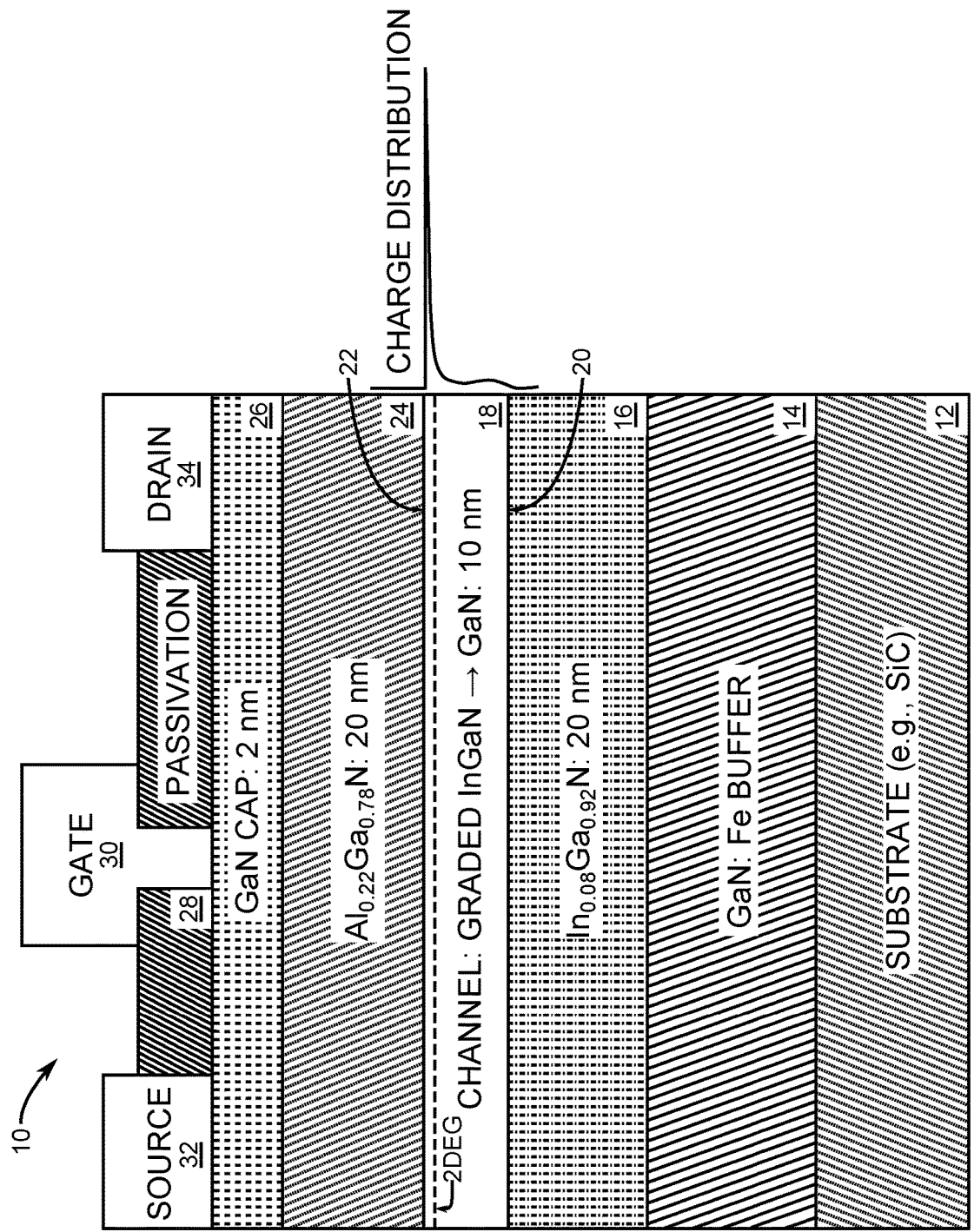
FIG. 1 is a cross-sectional structural diagram of an exemplary embodiment of a field-effect transistor of the present disclosure.
Figure 3:
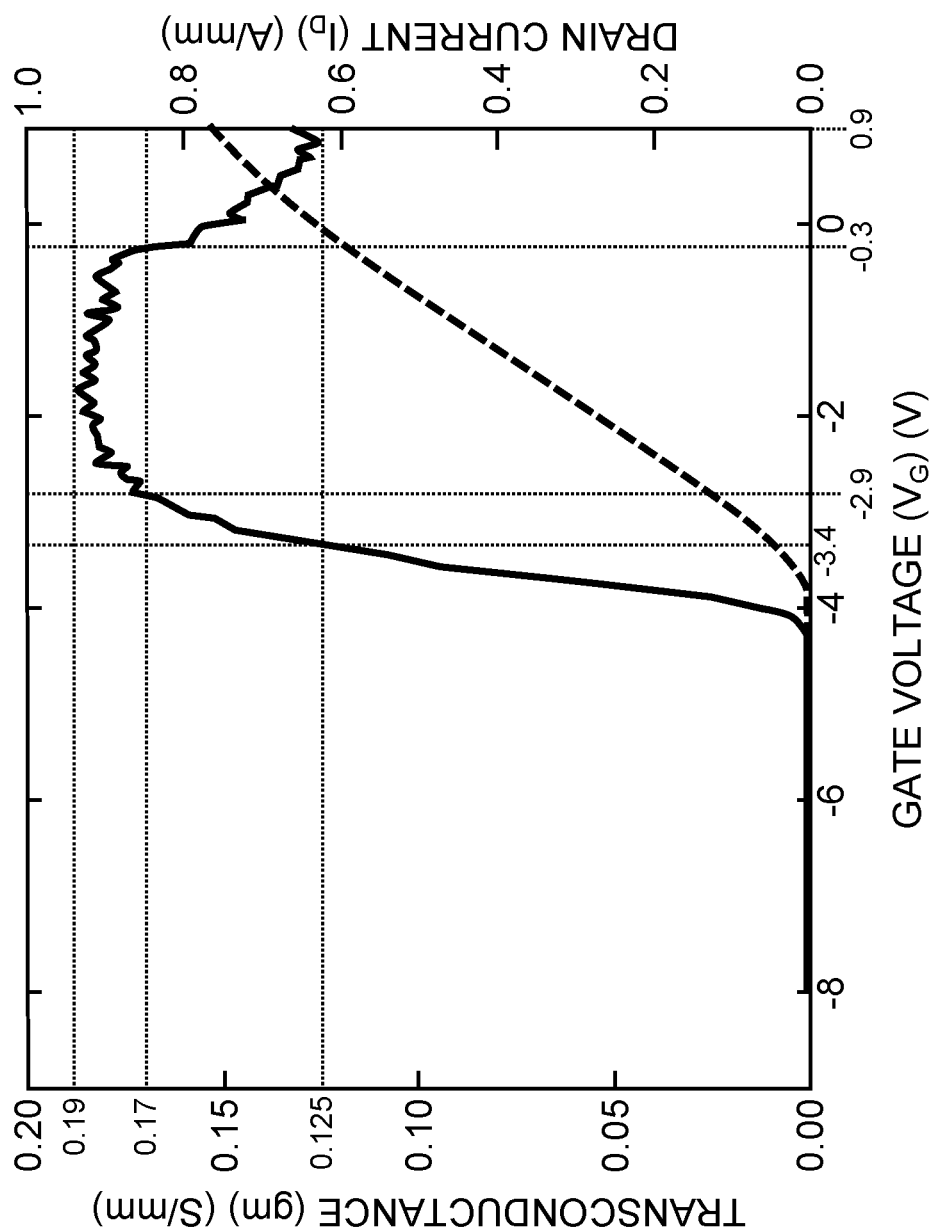

FIG. 3 provides a graph of transconductance and drain current versus gate voltage for the field-effect transistor of FIG. 1.

Figure 4:
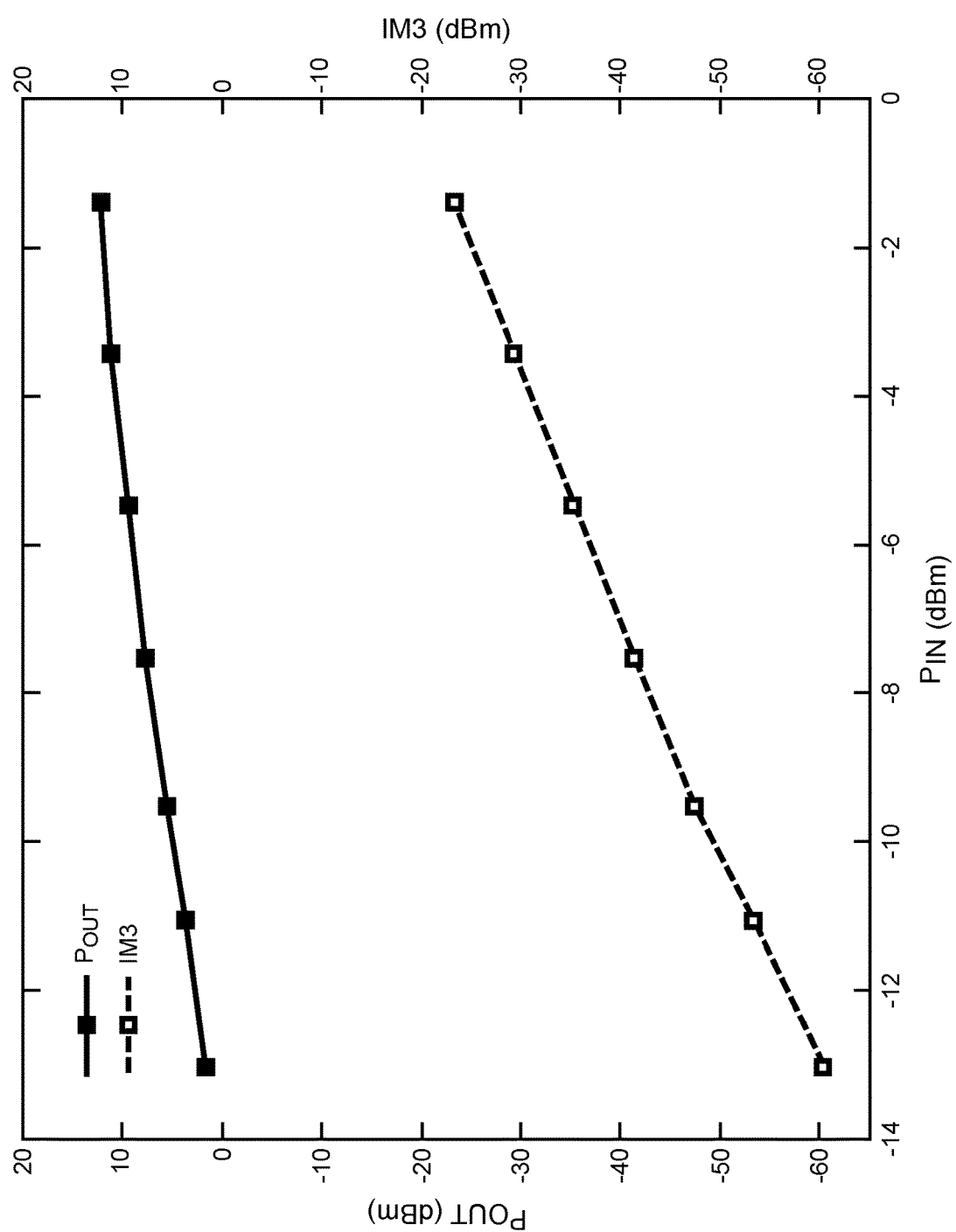

FIG. 4 is a graph of output power and third-order intermodulation distortion versus input power for the field-effect transistor of FIG. 1.

Figure 5:
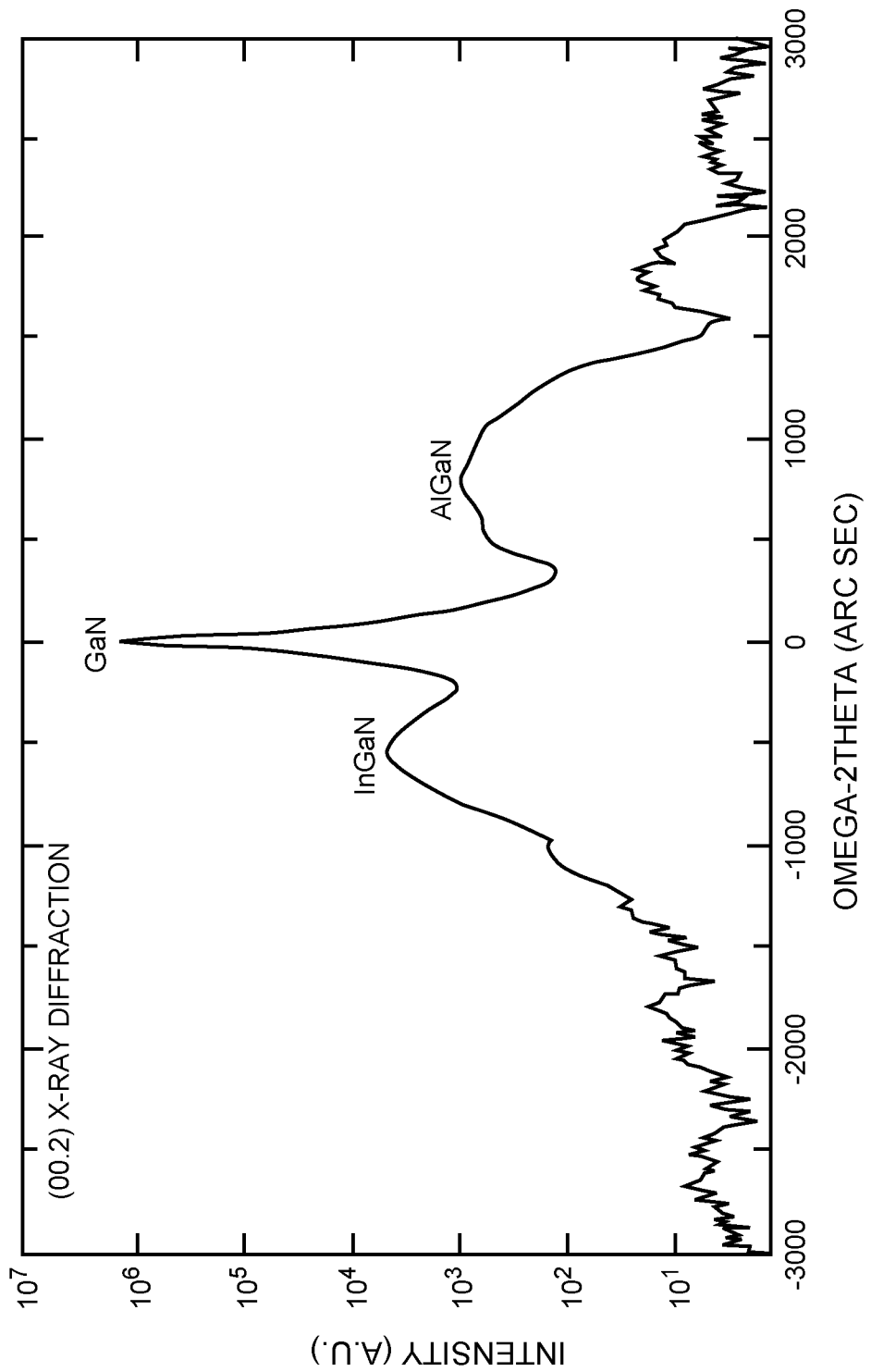

FIG. 5 is a graph of an X-ray diffraction of the field-effect transistor illustrating the grading of at least one element of a compound semiconductor within the channel layer.

Figure 6:
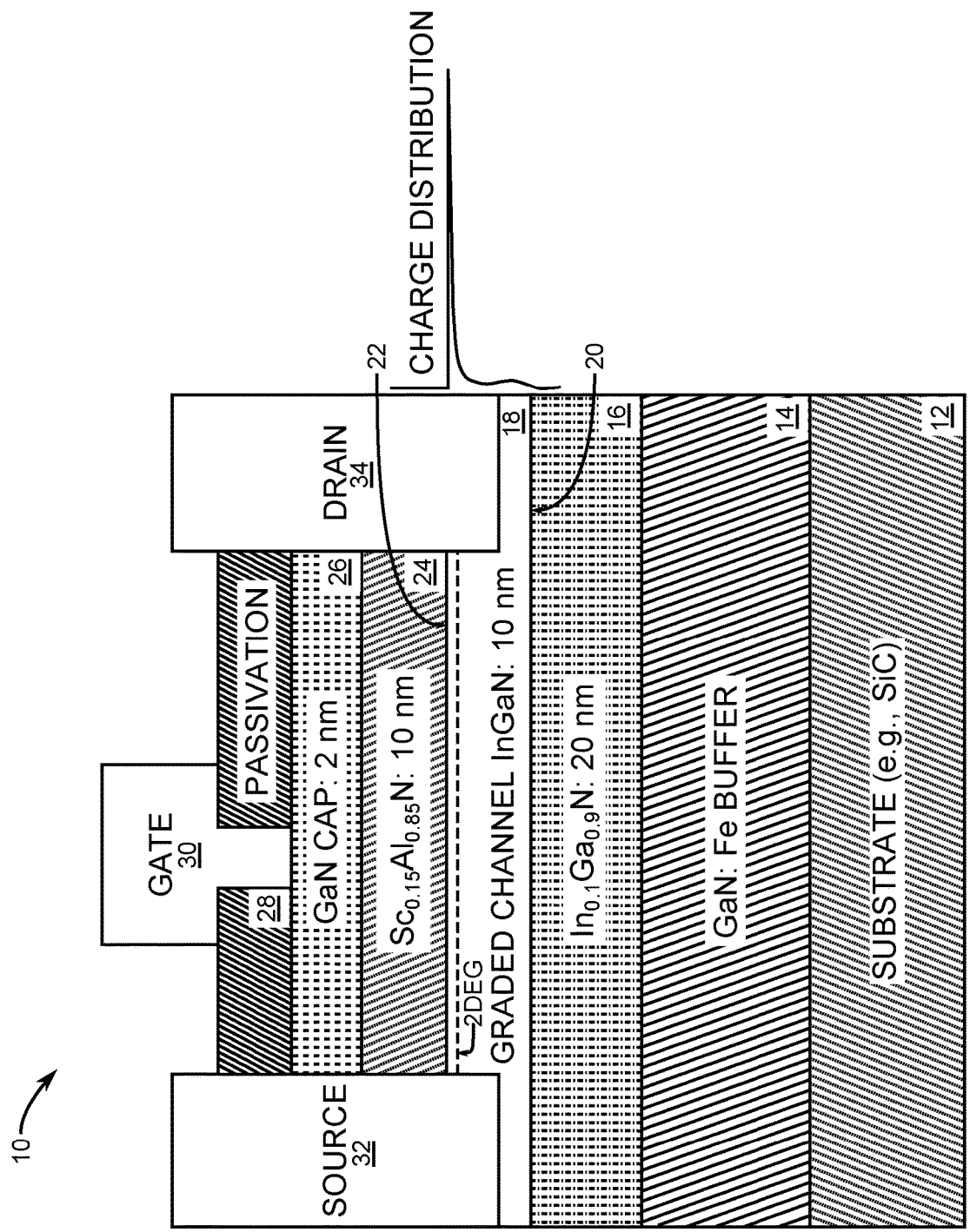

FIG. 6 a cross-sectional structural diagram of another exemplary embodiment of the field-effect transistor of the present disclosure.

Figure 7:
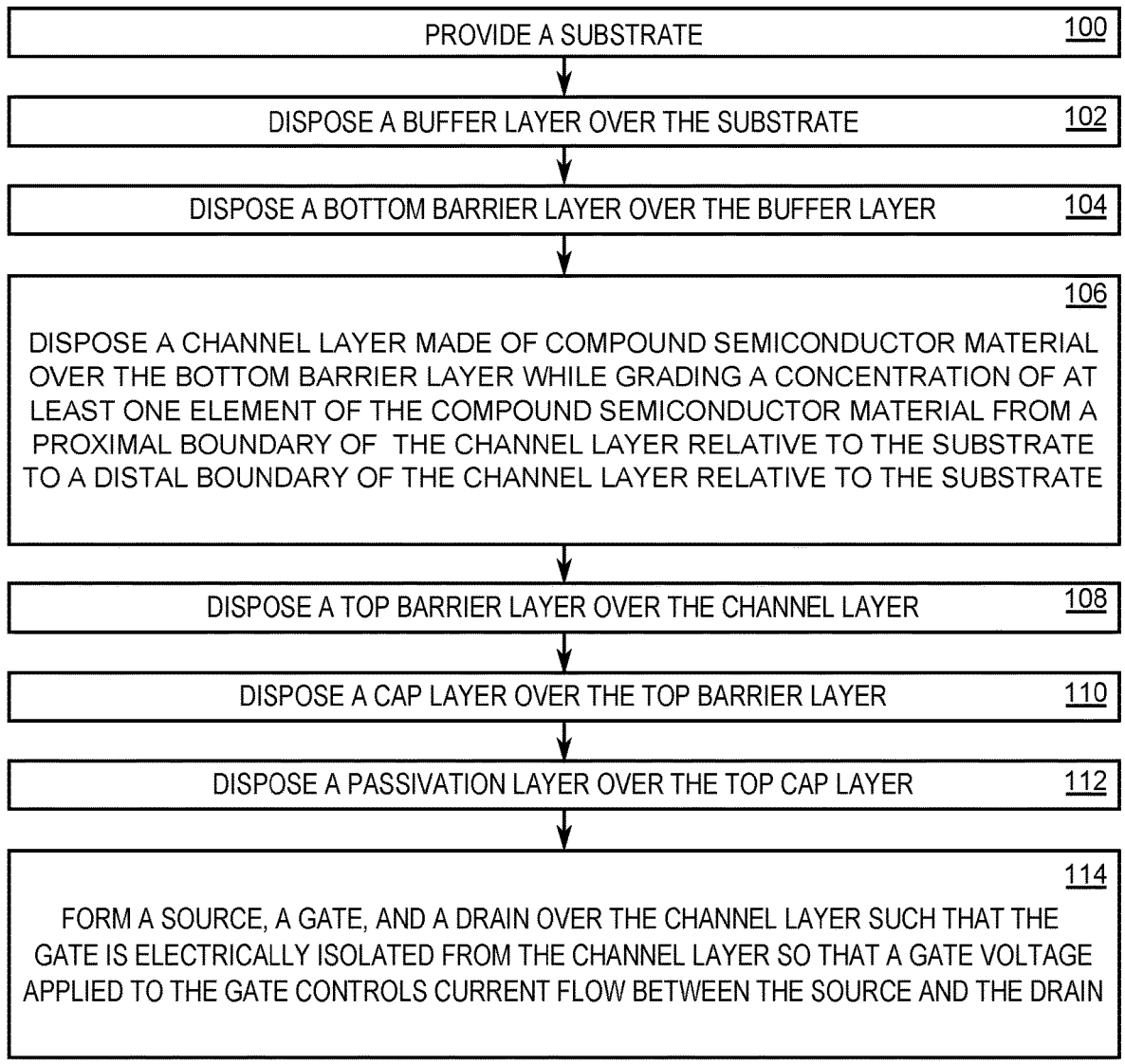

FIG. 7 is a process flowchart for manufacturing the field-effect transistor 10 of the present disclosure.

Figure 8:
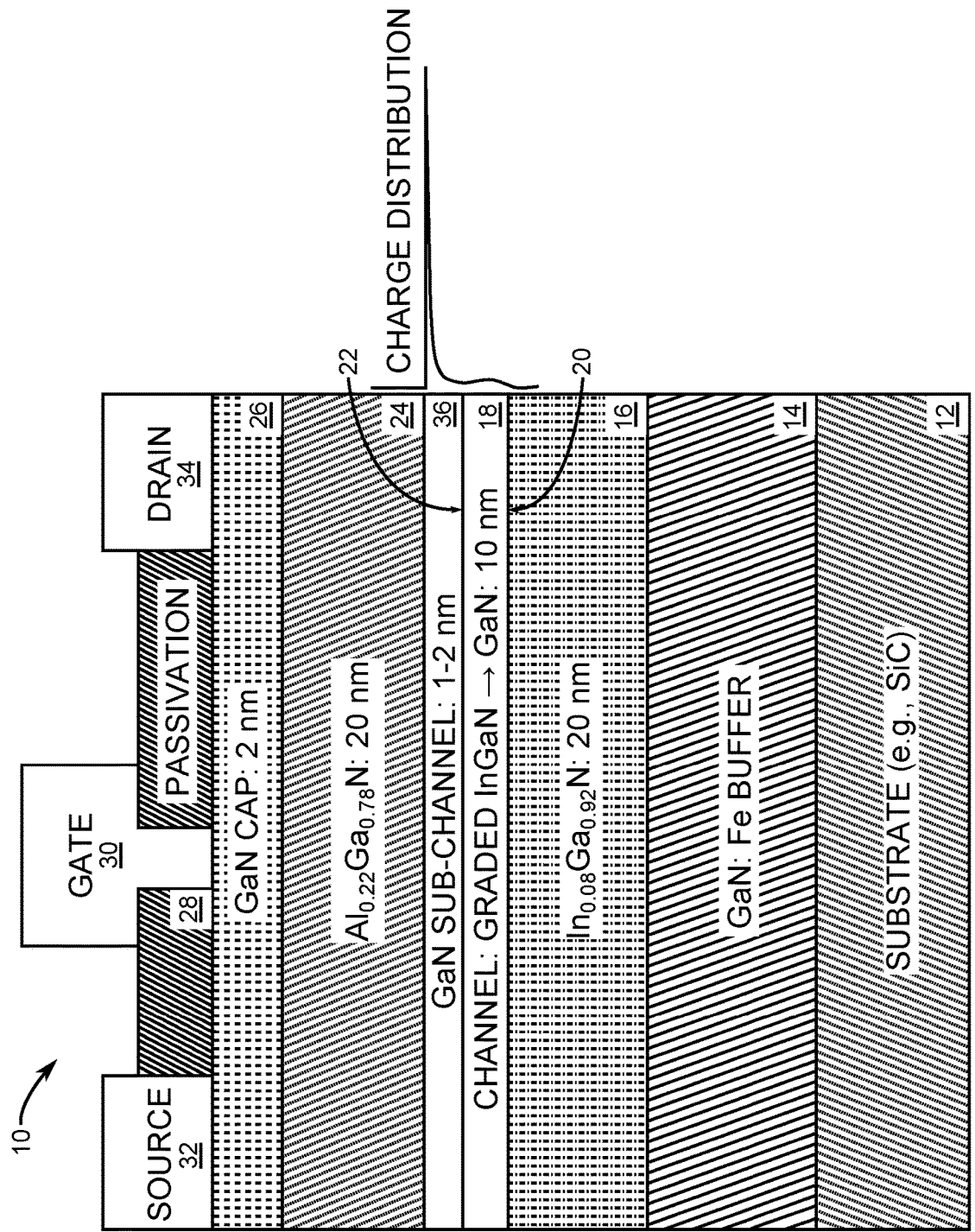

FIG. 8 is an embodiment of the field-effect transistor with conventional alloying contacts and a sub-channel layer sandwiched between the channel layer and the top barrier layer.

Figure 9:
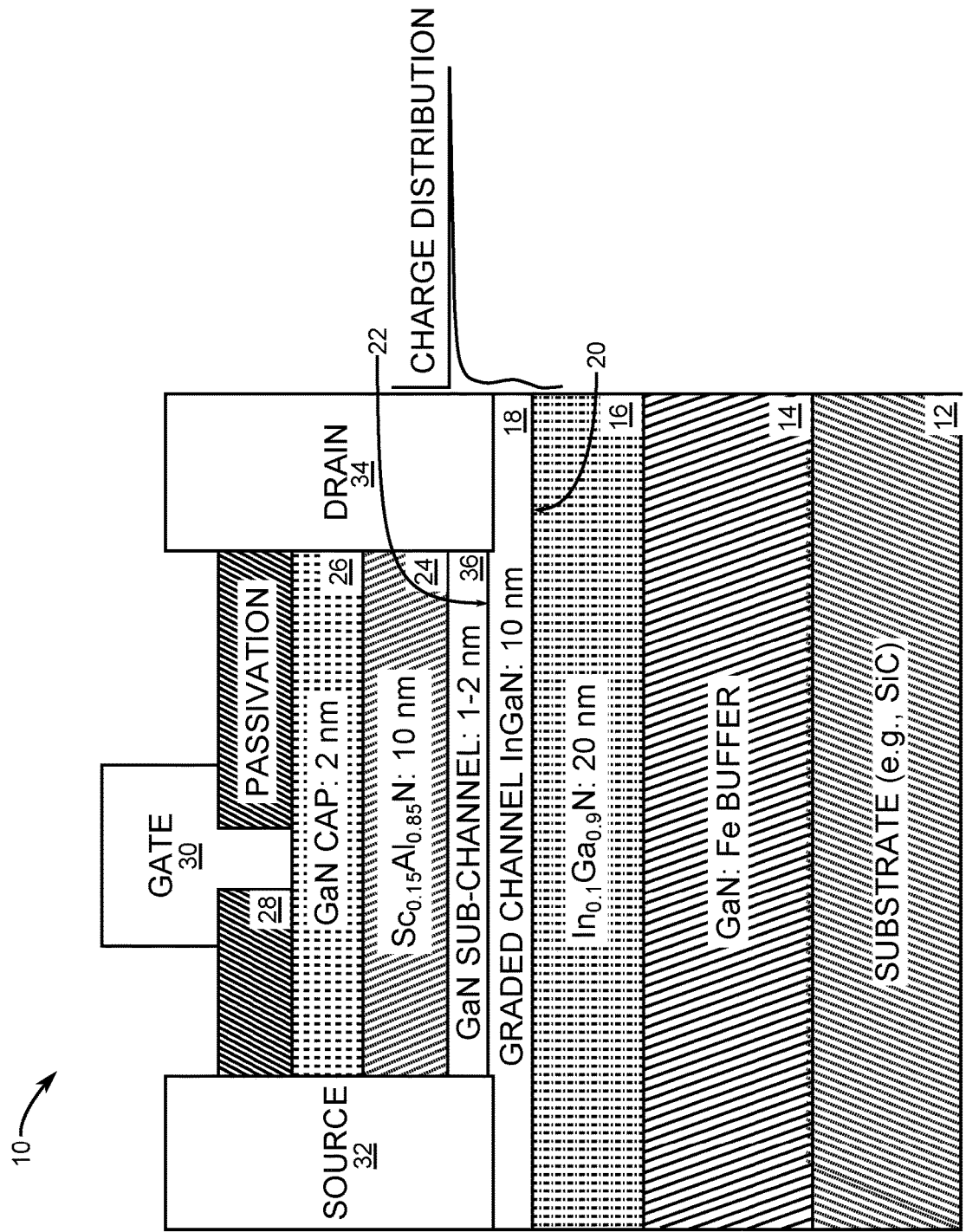

FIG. 9 is another embodiment of the field-effect transistor with regrown highly doped GaN contacts with the sub-channel layer sandwiched between the channel layer and the top barrier layer.

Figure 10:
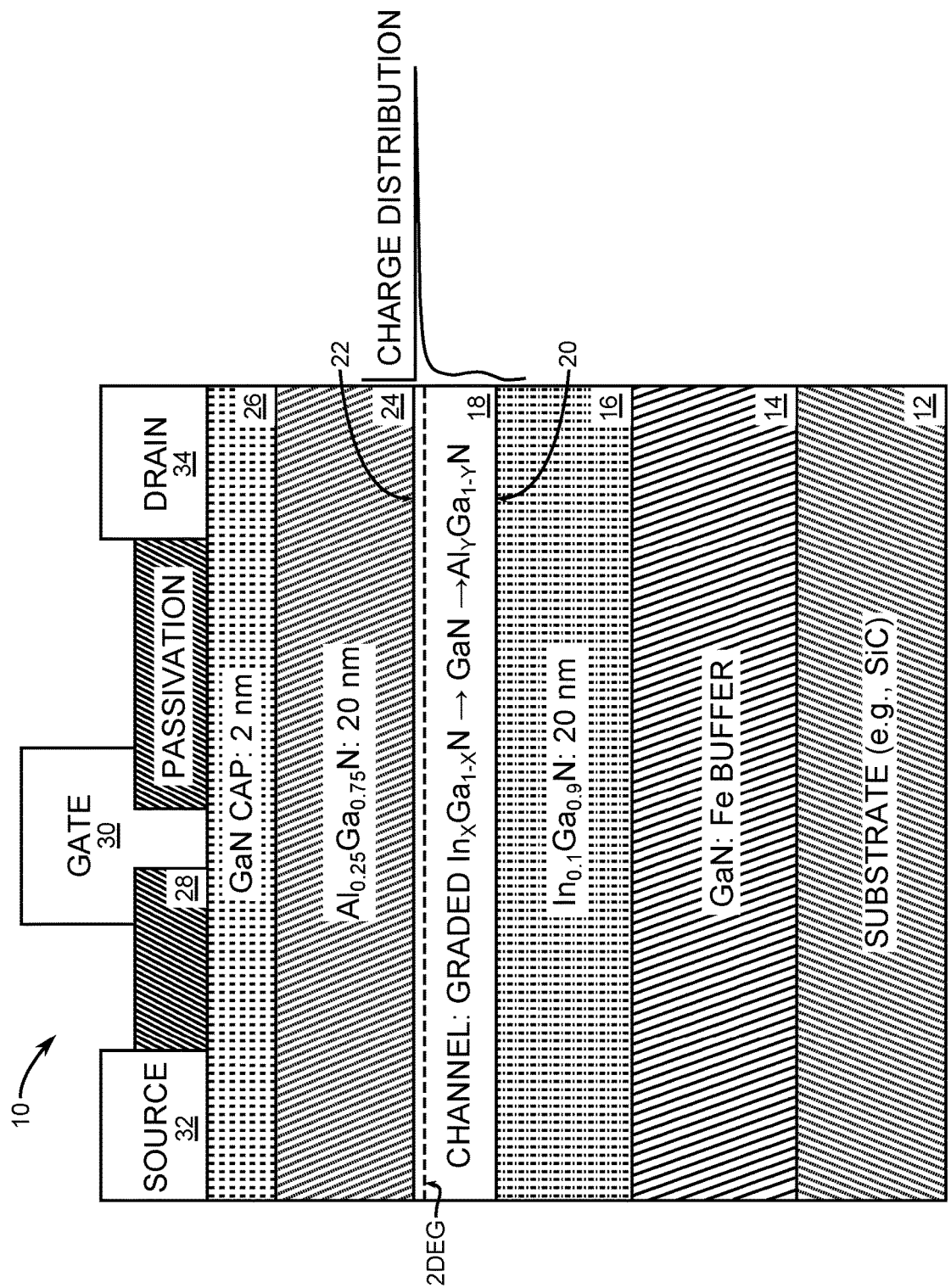

FIG. 10 is a cross-sectional structural diagram of an exemplary embodiment of a field-effect transistor of the present disclosure in which a channel layer is graded from InGaN to GaN and then to AlGaN.

Figure 11:
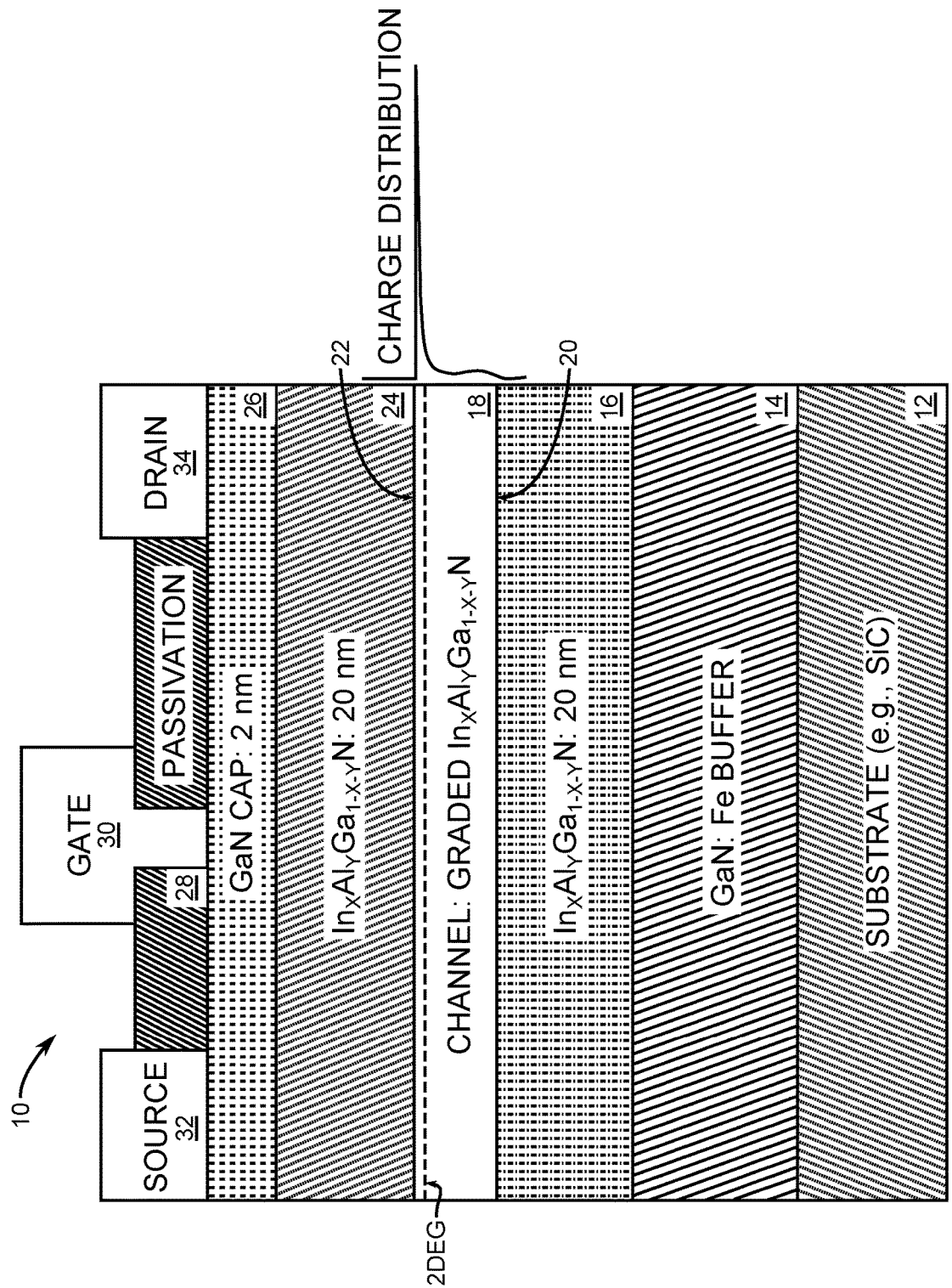

FIG. 11 is a cross-sectional structural diagram of an exemplary embodiment of a field-effect transistor of the present disclosure in which a channel layer is made of graded $In_XAl_YGa_{1-X-Y}N$.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, for the purpose of this disclosure compound semiconductors are semiconductors that are comprised of two or more chemically combined elements such as gallium and nitrogen to form gallium nitride. In contrast, elemental semiconductors comprise a single element such as silicon.

In this regard, embodiments of this disclosure grade elemental concentrations making up compound semiconductors such as gallium nitride and do not involve grading concentrations of substitutional impurity elements in elemental semiconductors such as silicon and germanium. FIG. 1 is a cross-sectional structural diagram of an exemplary embodiment of a field-effect transistor 10 of the present disclosure. The field-effect transistor 10 has a substrate 12 that in this exemplary embodiment is made of silicon carbide (SiC). Other substrates made of materials such as sapphire are also usable with embodiments of the present disclosure.

The exemplary field-effect transistor 10 further includes a buffer layer 14 that increases off-state breakdown voltage and may improve lattice matching to the substrate 12. In the exemplary embodiment of FIG. 1, the buffer layer 14 is made of iron-doped (Fe-doped) gallium nitride (GaN). A bottom barrier layer 16 is disposed over the buffer layer 14. In the exemplary embodiment of FIG. 1, the bottom barrier layer 16 is made of indium gallium nitride ($In_xGa_{1-x}N$) with a thickness range from 5 nm to 50 nm. Moreover, in this particular exemplary case, the bottom barrier layer 16 is $In_{0.08}Ga_{0.92}N$ with a thickness of 20 nanometers. Other embodiments of bottom barrier layer 16 have In concentrations that range from 3% to 12%.

A channel layer 18 has a proximal boundary 20 relative to the substrate 12 and a distal boundary 22 relative to the substrate 12. The channel layer 18 is disposed over the substrate 12, and in the exemplary embodiment of FIG. 1, the channel layer 18 is also disposed over the buffer layer 14 and directly onto the bottom barrier layer 16. Embodiments of the channel layer 18 have thicknesses that range from 5 nm to 20 nm. The channel layer 18 is made up of a compound semiconductor material that includes at least one element having a concentration that is graded between the proximal boundary 20 and the distal boundary 22 such that a transconductance (gm) of the field-effect transistor 10 remains within 65% of a maximum gm value of over at least 85% of a gate voltage range that transitions the field-effect transistor 10 between an on-state that allows substantial current flow through the channel layer 18 and an off-state that prevents substantial current flow through the channel layer 18. In some embodiments, the compound semiconductor material that includes at least one element has a concentration that is graded between the proximal boundary 20 and the distal boundary 22, wherein a lower concentration of the at least one element at the distal boundary 22 of the channel layer 18 is no greater than 10% of a higher concentration of the at least one element at the proximal boundary 20 of the channel layer 18.

In the exemplary embodiment of FIG. 1, the compound semiconductor material making up channel layer 18 is indium gallium nitride that has a graded concentration of the element indium. In the exemplary embodiment, the concentration of indium has been reduced to practically zero at the distal boundary 22. As such, in this exemplary embodiment, the channel layer 18 can be considered graded from indium gallium nitride (InGaN) having a predetermined concentration of indium at the proximal boundary 20 to GaN with only trace amounts of indium, if any, at the distal boundary 22. In one exemplary embodiment, the semiconductor material making up channel layer 18 begins as $In_{0.08}Ga_{0.92}N$ at the proximal boundary 20 and is graded to GaN at the distal boundary 22. In yet another exemplary embodiment, the semiconductor material making up channel layer 18 begins as $In_{0.06}Ga_{0.94}N$ at the proximal boundary 20 and is graded to GaN at the distal boundary 22. A grading of the indium concentration between the proximal boundary 20 and the distal boundary 22 may be linear or non-linear. In the exemplary embodiment of FIG. 1, the channel layer 18 has a thickness of 10 nm.

Further still in the exemplary embodiment of FIG. 1, a top barrier layer 24 is disposed over the channel layer 18, and in this particular embodiment, the top barrier layer 24 is disposed directly onto the channel layer 18. The top barrier layer 24 in this exemplary case is made of aluminum gallium nitride (AlGaN) and in this particular embodiment is made of $Al_{0.22}Ga_{0.78}N$ and has a thickness of 20 nm. In at least one embodiment, the bottom barrier layer 16 and the top barrier layer 24 are configured to confine a two-dimensional electron gas (2 DEG) to within the channel layer 18 and/or increase the electron density of the 2 DEG. A dashed line within the representation of the channel layer 18 in FIG. 1 along with a representation of charge distribution illustrates the confinement and enhanced charge density provided by the field-effect transistor 10.

In the exemplary embodiment of FIG. 1, a cap layer 26 is disposed over the top barrier layer 24. The cap layer 26 is made of GaN and is configured to provide various electrical characteristic improvements such as better reliability and reduced ohmic contact resistance. In the exemplary embodiment of FIG. 1, the cap layer 26 is 2 nm thick. A passivation layer 28 is disposed over the cap layer 26. A gate 30, a source 32, and a drain 34 are formed over the channel layer, such that the gate 30 is electrically isolated from the channel layer 18, the source 32, and the drain 34. Moreover, the source 32 and the drain 34 are spaced apart from the gate 30 and each other. Note that depictions of structures in FIG. 1 are not intended to be to scale.

Figure 2:
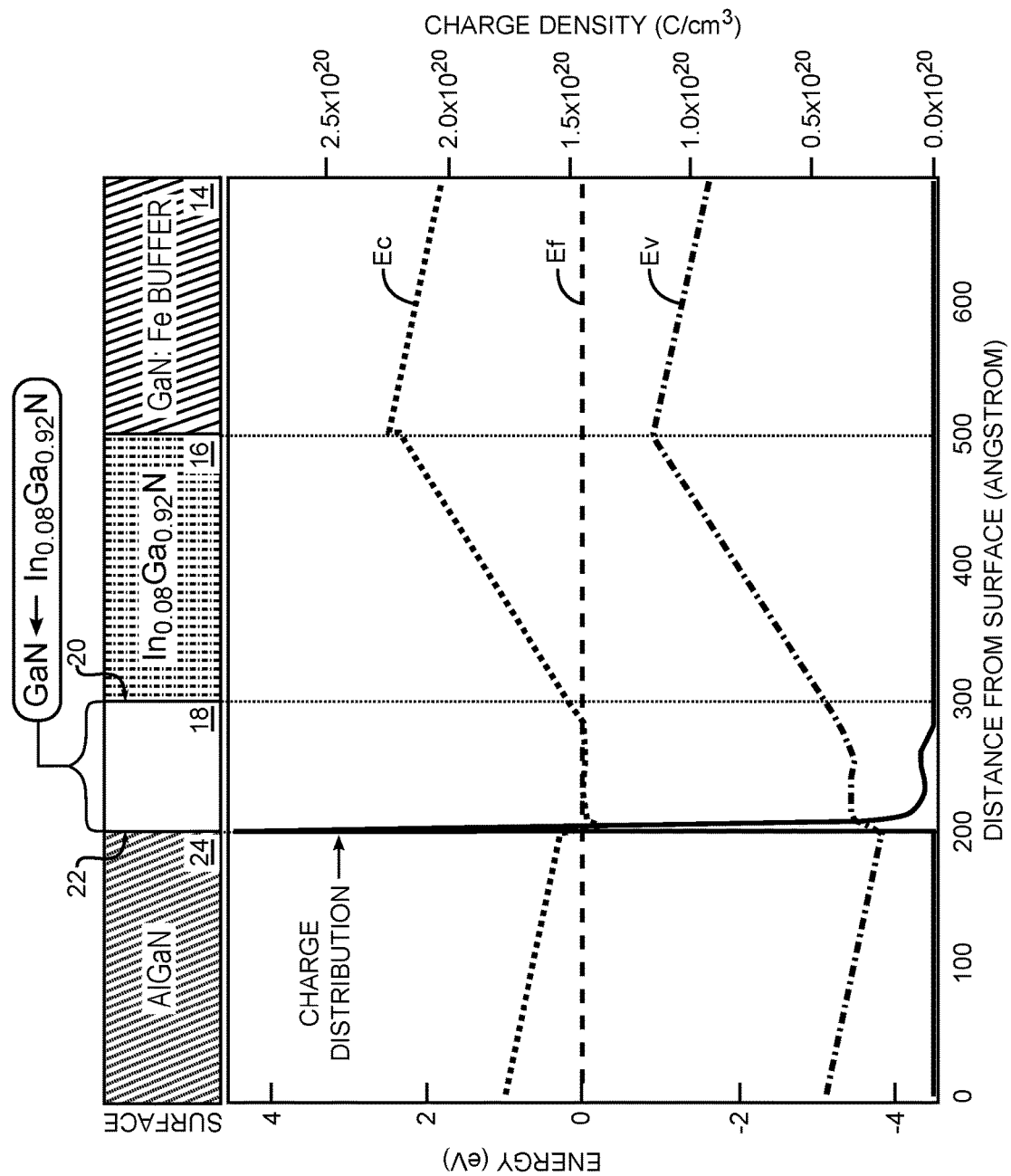
FIG. 2 is a graph of energy and charge density versus distance through a portion of an epitaxial stack comprising the field-effect transistor of FIG. 1.

FIG. 2 is a graph of energy and charge density versus distance through a portion of an epitaxial stack comprised of the buffer layer 14, the bottom barrier layer 16, the channel layer 18, and the top barrier layer 24 of an exemplary embodiment of the field-effect transistor 10. Energy levels are presented in electron volts (eV), distance is presented in angstroms, and charge density is presented in coulombs per cubic centimeter ($C/cm^3$). A short dashed line labeled Ec depicts conduction band edge energy that within the channel layer 18 aligns with the Fermi energy level represented by a longer dashed line labeled Ef. A dotted-dashed line labeled Ev depicts valance band edge energy.

A solid line labeled charge distribution within the graph shows that charge density greater than $2.5 \times 10^{20}$ $C/cm^3$ near the distal boundary 22 of the channel layer 18. As a result of the grading of the semiconductor material, which in this example starts as $In_{0.08}Ga_{0.92}N$ at the proximal boundary 20 and concludes as GaN at the distal boundary 22, the 2 DEG spreads out towards the proximal boundary 20. As such, the gm profile is modified to have a flatter top. In other words, the gm is more constant across a larger range of gate voltage than is possible without the grading of element concentration of the compound semiconductor material making up the channel layer 18.

In this regard, FIG. 3 provides a graph of transconductance (gm) in siemens per millimeter (S/mm) and drain current in amperes per millimeter (A/mm) versus gate voltage $V_G$ in volts (V). In this particular example, gm varies no more than 0.08 S/mm from 0 V to −3.4 V. Thus, in this example, gm of the field-effect transistor 10 remains within 65% of a maximum gm value of 0.19 S/mm over at least 85% of a gate voltage range that transitions the field-effect transistor 10 between an on-state that allows substantial current flow through the channel layer 18 and an off-state that prevents substantial current flow through the channel layer 18. Moreover, in this particular example, gm varies no more 0.02 S/mm over a 2.6 V range of gate voltage. Thus, in this example, gm of the field-effect transistor 10 remains within 89% of a maximum gm value of 0.19 S/mm over at least 65% of the gate voltage range that transitions the field-effect transistor between the on-state and the off-state. Further still, notice that the drain current $I_D$ is linear over this same range that extends from −0.3 V to −2.9 V.

In this regard, FIG. 4 is a graph of output power ($P_{OUT}$) and third-order intermodulation distortion (IM3) versus input power ($P_{IN}$) for the field-effect transistor 10 of FIG. 1. In particular, FIG. 4 shows highly linear performance for the field-effect transistor 10 with an IM3 of lower than −20 dBm for an input power $P_{IN}$ of −1.5 dBm and a corresponding output power $P_{OUT}$ greater than 10 dBm. Moreover, the field-effect transistor 10 has an IM3 of lower than −60 dBm for a $P_{IN}$ of −13 dBm with a corresponding $P_{OUT}$ that is greater than 0 dBm. Further still, a linear figure of merit for the field-effect transistor 10 is its output third-order intercept point divided by direct current supply power ($OIP3/P_{DC}$), which in this exemplary case is 3.2 dB. Moreover, the exemplary field-effect transistor 10 has an input third-order intercept point (IIP3) equal to 15 dBm and an OIP3 equal to 29 dBm.

FIG. 5 is a graph of an X-ray diffraction of the field-effect transistor 10 that illustrates the grading of InGaN to GaN within the channel layer 18. In the exemplary embodiment of the field-effect transistor 10 depicted in FIG. 1, the compound semiconductor material is InGaN, and the at least one element is In. In particular, the X-ray diffraction shows that as the concentration of the element In is graded downwardly, the concentration of Ga increases until at the location of distal boundary 22 (FIG. 1) the semiconductor material is GaN with only trace amounts of In, if any.

FIG. 6 a cross-sectional structural diagram of another exemplary embodiment of the field-effect transistor 10 of the present disclosure. In this particular embodiment, the source 32 and the drain 34 extend into the channel layer 18. Other differences include a different compound semiconductor material for the top barrier layer 24 and a different In/Ga ratio for the bottom barrier layer 16. In this case the top barrier layer 24 is made up of scandium aluminum nitride (ScAlN), and specifically $Sc_{0.15}Al_{0.85}N$. The ScAlN may provide better lattice matching with GaN and a relatively higher sheet charge density within the channel layer 18 compared with the AlGaN used for the top barrier layer 24 in the embodiment of FIG. 1.

FIG. 7 is a process flowchart for manufacturing the field-effect transistor 10 (FIGS. 1 and 6) of the present disclosure. An initial step is to provide the substrate 12 (step 100). The substrate 12 may be made of SiC or sapphire or other substrate material usable to fabricate GaN technology devices. A next step is to dispose the buffer layer 14 over the substrate 12 (step 102). The buffer layer 14 may be made of Fe-doped GaN and may have sub-layers such as a 5 nm thick AlN nucleation layer. A following step is to dispose the bottom barrier layer 16 over the substrate 12, and in the exemplary embodiments of FIG. 1 and FIG. 6, the bottom barrier layer 16 is disposed directly onto the buffer layer 14 (step 104).

A next step is to dispose the channel layer 18 made of compound semiconductor material over the bottom barrier layer 16 while grading a concentration of at least one element of the semiconductor material from the proximal boundary 20 to the distal boundary 22 (step 106). A particular grading of the element concentration may be selected to be either linear or non-linear in order to configure the channel layer 18 such that gm of the field-effect transistor 10 remains within a predetermined percentage of a maximum gm value over a predetermined gate voltage range that transitions the field-effect transistor 10 between an on-state that allows substantial current flow through the channel layer 18 and an off-state that prevents substantial current flow through the channel layer 18. The channel layer 18 may be disposed directly onto the bottom barrier layer 16 as shown in FIG. 1 and FIG. 6.

A following step is to dispose the top barrier layer 24 over the channel layer 18 (step 108). In the exemplary embodiments of FIG. 1 and FIG. 6, the top barrier layer 24 is in direct contact with a top surface of the channel layer 18. A next step is to dispose the cap layer 26 over the top barrier layer 24 (step 110). The cap layer 26 is shown in FIG. 1 and FIG. 6 as being in direct contact with a top surface of the top barrier layer 24.

A following step is to dispose the passivation layer 28 over the cap layer 26 (step 112). The passivation layer 28 may be disposed directly onto the cap layer 26 as depicted in FIG. 1 and FIG. 6. A suitable material for the passivation layer is silicon nitride (SiN). A remaining step is to dispose the source 32, the gate 30, and the drain 34 over the channel layer 18 such that the gate is electrically isolated for the channel layer, so that a gate voltage applied to the gate 30 controls current flow between the source 32 and the drain 34 (step 114).

FIG. 8 is an embodiment of the field-effect transistor 10 with conventional alloying contacts and a sub-channel layer 36 sandwiched between the channel layer 18 and the top barrier layer 24. The sub-channel layer 36 improves electron mobility over the embodiment of FIG. 1. In this exemplary embodiment, the sub-channel layer 36 is made of GaN.

FIG. 9 is another embodiment of the field-effect transistor 10 with the source 32 and the drain 34 included as regrown highly doped GaN contacts with the sub-channel layer 36 sandwiched between the channel layer 18 and the top barrier layer 24. In this exemplary embodiment, the regrown GaN contacts are in direct contact with the 2 DEG and have ultra-low ohmic resistance for device scaling. In this case, the sub-channel layer 36 improves electron mobility over the embodiment of FIG. 6. In this exemplary embodiment, the sub-channel layer 36 is made of GaN. Generally, the bottom barrier layer 16, the channel layer 18, and the top barrier layer 24 may be made of group III-V compound semiconductor materials. Examples of group III-V semiconductor materials include, but are not limited to, aluminum gallium nitride, scandium aluminum nitride, indium aluminum gallium nitride, and scandium aluminum gallium nitride.

In another exemplary embodiment depicted in FIG. 10, the channel layer 18 is made of InGaN, GaN, and AlGaN that has a graded concentration of the element indium and a graded concentration of the element aluminum. In this exemplary embodiment, the top barrier layer 24 is made up of AlGaN disposed over the channel layer 18 beginning at the distal boundary 22, wherein the indium gallium nitride of the channel layer 18 has a graded concentration of indium that is reduced to gallium nitride and then a graded concentration of aluminum that is increased to a concentration of aluminum in the aluminum gallium of the top barrier layer. As with the previous embodiments, gm of the field-effect transistor 10 remains within 65% of a maximum gm value over at least 85% of a gate voltage range that transitions the field-effect transistor 10 between an on-state that allows substantial current flow through the channel layer 18 and an off-state that prevents substantial current flow through the channel layer 18. The grading of the indium and aluminum concentrations between the proximal boundary 20 and the distal boundary 22 may be linear or non-linear. In the exemplary embodiment of FIG. 10, the channel layer 18 begins as $In_{0.1}Ga_{0.9}N$ at the proximal boundary 20 and ends at the distal boundary as $Al_{0.25}Ga_{0.75}N$. The channel layer 18 in this exemplary embodiment has a thickness of 10 nm±10%.

FIG. 11 is a cross-sectional structural diagram of an exemplary embodiment of a field-effect transistor 10 of the present disclosure in which the channel layer 18 is made of graded $In_XAl_YGa_{1-X-Y}N$. In this exemplary embodiment, X ranges between 0.1 and zero from the proximal boundary 20 to the distal boundary 22, while Y ranges between zero at the proximal boundary 20 and 0.25 at the distal boundary 22. However, in some exemplary embodiments, X and Y do not equal zero simultaneously to result in GaN within the channel layer 18. The grading of the $In_XAl_YGa_{1-X-Y}N$ between the proximal boundary 20 and the distal boundary 22 may be linear or non-linear. In other words, X and Y may change linearly or non-linearly depending upon a desired application. As with the previous embodiments, gm of the field-effect transistor 10 remains within 65% of a maximum gm value over at least 85% of a gate voltage range that transitions the field-effect transistor 10 between an on-state that allows substantial current flow through the channel layer 18 and an off-state that prevents substantial current flow through the channel layer 18. In the exemplary embodiment of FIG. 11, the channel layer has a thickness of 10 nm±10%.

Those skilled in the art will recognize improvements and modifications to the preferred embodiments of the present disclosure. All such improvements and modifications are considered within the scope of the concepts disclosed herein and the claims that follow.

What is claimed is:

1. A field-effect transistor comprising:
a substrate;
a channel layer having a proximal boundary relative to the substrate and a distal boundary relative to the substrate, wherein the channel layer is disposed over the substrate; and
a gate electrically isolated from the channel layer, a source, and a drain disposed over the channel layer, wherein the channel layer comprises a compound semiconductor material that includes at least one element having a concentration that is graded throughout the entire channel layer between the proximal boundary and the distal boundary beneath the drain, the gate, and the source, wherein a lower concentration of the at least one element at the distal boundary of the channel layer is no greater than 10% of a higher concentration of the at least one element at the proximal boundary of the channel layer such that transconductance (gm) of the field-effect transistor remains within 65% of a maximum gm value over at least 85% of a gate voltage range that transitions the field-effect transistor between an on-state that allows substantial current flow between the drain and the source through the channel layer and an off-state that prevents substantial current flow between the drain and the source through the channel layer.

2. The field-effect transistor of claim 1 wherein the concentration of the at least one element decreases linearly between the proximal boundary and the distal boundary.

3. The field-effect transistor of claim 1 wherein the concentration of the at least one element decreases non-linearly between the proximal boundary and the distal boundary.

4. The field-effect transistor of claim 1 wherein a bottom barrier layer is disposed between the substrate and the channel layer.

5. The field-effect transistor of claim 4 further includes a top barrier layer disposed over the channel layer.

6. The field-effect transistor of claim 5 wherein the bottom barrier layer and the top barrier layer are configured to confine a two-dimensional electron gas to within the channel layer.

7. A field-effect transistor comprising:
a substrate;
a channel layer having a proximal boundary relative to the substrate and a distal boundary relative to the substrate, wherein the channel layer is disposed over the substrate and comprises indium gallium nitride, gallium nitride, and aluminum gallium nitride;
a top barrier layer comprising aluminum gallium nitride disposed over the channel layer beginning at the distal boundary, wherein the indium gallium nitride of the channel layer has a graded concentration of indium that is reduced to gallium nitride and then a graded concentration of aluminum that is increased to a concentration of aluminum in the aluminum gallium nitride of the top barrier layer such that transconductance (gm) of the field-effect transistor remains within 65% of a maximum gm value over at least 85% of a gate voltage range that transitions the field-effect transistor between an on-state that allows substantial current flow through the channel layer and an off-state that prevents substantial current flow through the channel layer; and a gate, a source, and a drain disposed over the channel layer, wherein the gate is electrically isolated from the channel layer such that a gate voltage applied to the gate controls current flow between the source and the drain.

8. The field-effect transistor of claim 7 wherein the graded concentration of indium decreases linearly between the proximal boundary and the distal boundary.

9. The field-effect transistor of claim 7 wherein the graded concentration of indium decreases non-linearly between the proximal boundary and the distal boundary.

10. The field-effect transistor of claim 7 wherein the channel layer begins as $In_{0.1}Ga_{0.90}N$ at the proximal boundary.

11. The field-effect transistor of claim 7 wherein a bottom barrier layer is disposed between the substrate and the channel layer.

12. The field-effect transistor of claim 11 wherein the bottom barrier layer and the top barrier layer are configured to confine a two-dimensional electron gas to within the channel layer.

13. A field-effect transistor comprising:

a substrate;

a bottom barrier layer comprising $In_XAl_YGa_{1-X-Y}N$ disposed over the substrate and ending at a proximal boundary relative to the substrate;

a channel layer beginning at the proximal boundary and ending at a distal boundary relative to the substrate, wherein the channel layer is disposed over the substrate and comprises indium aluminum gallium nitride ($In_X Al_YGa_{1-X-Y}N$);

a top barrier layer comprising $In_XAl_YGa_{1-X-Y}N$ disposed over the channel layer beginning at the distal boundary, wherein the $In_XAl_YGa_{1-X-Y}N$ of the channel layer has graded concentrations of indium, aluminum, and gallium, wherein X decreases between the proximal boundary and the distal boundary and Y increases between the proximal boundary and the distal boundary such that transconductance (gm) of the field-effect transistor remains within 65% of a maximum gm value over at least 85% of a gate voltage range that transitions the field-effect transistor between an on-state that allows substantial current flow through the channel layer and an off-state that prevents substantial current flow through the channel layer; and a gate, a source, and a drain disposed over the channel layer, wherein the gate is electrically isolated from the channel layer such that a gate voltage applied to the gate controls current flow between the source and the drain.

14. The field-effect transistor of claim 13 wherein X ranges between 0.1 and zero from the proximal boundary to the distal boundary.

15. The field-effect transistor of claim 13 wherein Y ranges between zero at the proximal boundary and 0.25 at the distal boundary.

16. The field-effect transistor of claim 13 wherein X ranges between 0.1 and zero from the proximal boundary to the distal boundary, while Y ranges between zero at the proximal boundary and 0.25 at the distal boundary.

17. The field-effect transistor of claim 16 wherein X and Y are not simultaneously zero within the channel layer.

18. The field-effect transistor of claim 13 wherein the $In_XAl_YGa_{1-X-Y}N$ is graded linearly.

19. The field-effect transistor of claim 13 wherein the $In_XAl_YGa_{1-X-Y}N$ is graded non-linearly.

20. The field-effect transistor of claim 13 wherein the bottom barrier layer and the top barrier layer are configured to confine a two-dimensional electron gas to within the channel layer.

\* \* \* \* \*